(12) United States Patent
Carpenter et al.

(10) Patent No.: US 6,559,462 B1
(45) Date of Patent: May 6, 2003

(54) METHOD TO REDUCE DOWNTIME WHILE IMPLANTING $GEF_4$

(75) Inventors: Nicole Susan Carpenter, Burlington, VT (US); Robert E. Fields, Colchester, VT (US); Nicholas Mone, Jr., Essex Junction, VT (US); Gary Michael Prescott, Essex Junction, VT (US); Donald Walter Rakowski, Milton, VT (US); Richard S. Ray, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 09/702,348

(22) Filed: Oct. 31, 2000

(51) Int. Cl.⁷ .......................... H01J 37/317; H01J 37/08
(52) U.S. Cl. ............................ 250/492.21; 250/423 R; 315/111.81
(58) Field of Search ........................ 250/492.21, 423 R; 315/111.81

(56) References Cited

U.S. PATENT DOCUMENTS

| | | | |
|---|---|---|---|
| 4,512,812 A | 4/1985 | Liebert et al. | 134/21 |
| 5,354,698 A | 10/1994 | Cathey, Jr. | 437/20 |
| 5,507,874 A | 4/1996 | Su et al. | 134/1 |
| 5,554,854 A | 9/1996 | Blake | 250/492.21 |
| 5,633,506 A | 5/1997 | Blake | 250/492.21 |
| 5,880,013 A | 3/1999 | Yang et al. | 438/514 |
| 5,988,103 A | 11/1999 | Fetherston et al. | 118/723 |
| 6,135,128 A * | 10/2000 | Graf et al. | 250/423 R |
| 6,215,125 B1 * | 4/2001 | Chen et al. | 250/492.21 |

* cited by examiner

Primary Examiner—Jack Berman
(74) Attorney, Agent, or Firm—Anthony J. Canale; Robert A. Walsh; James M. Leas

(57) ABSTRACT

The operating lifetime of a hot cathode discharge ion source is extended by introducing nitrogen into an ion implantation apparatus after introduction of an ion implantation gas, such as $GeF_4$, is stopped. The nitrogen is preferably introduced along with the $GeF_4$ during implantation as well.

34 Claims, 2 Drawing Sheets

METHOD TO REDUCE DOWNTIME WHILE IMPLANTING GEF$_4$

FIELD OF THE INVENTION

The present invention is related to ion implantation. More particularly it is related to a method of reducing downtime for an ion implantation tool. Even more particularly it is related to a method for extending the lifetime of a hot cathode discharge ion source.

BACKGROUND OF THE INVENTION

Ge$^+$ ion implants have been widely used in the semiconductor industry to pre-amorphize silicon wafers in order to prevent channeling effects. The demands for these pre-amorphizing implants are expected to increase greatly in future semiconductor device manufacturing. The most popular ion feed gas for Ge$^+$ beams is GeF$_4$, because of its stable chemical properties and cost effectiveness. However, very short lifetimes of the hot cathode discharge ion sources, from about 10 to 30 hours, have been observed while operating with GeF$_4$ gas. This compares to a source lifetime of about 150 to 300 hours when BF$_3$, AsH$_3$, or PH$_3$ is implanted. When GeF$_4$, BF$_3$, AsH$_3$, PH$_3$ are implanted for various purposes using the same source in an ion implant tool, the source lifetime is still limited to about 10 to 30 hours of operation with GeF$_4$ itself.

The common source failure mode is that some materials deposit on the cathode surfaces of the hot cathode discharge ion source during extended use of the ion implantation apparatus. This deposition reduces the thermionic emission rate of the source ions from the hot cathode surfaces. The deposition can also cause a short between the cathode and the arc chamber. The short can be a direct short or it can extend along the deposited coating along an insulator. Consequently, the desired arc currents cannot be obtained and the hot cathode discharge sources have to be replaced in order to maintain normal source operation. The short source life increases downtime and greatly reduces the productivity of an ion implanter.

The cause of the short source life in GeF$_4$ ion implantation is believed to be excessive, free fluorine atoms in the ion source due to the chemical dissociation of GeF$_4$ molecules. The arc chamber material is etched away by chemical reaction of the fluorine atoms with the material of the arc chamber. Some of the arc chamber material may eventually deposit on the hot cathode resulting in the degradation of electron emissions from the hot cathode discharge source.

Other implantation gases besides GeF$_4$ are employed in ion implantation and these other gases may also cause shortening of the lifetime of the hot cathode discharge ion source. The term "hot cathode discharge ion source" is used herein to denote any thermionic emission element which when heated to a temperature of at least 1200° C. emits electrons. The exact temperature at which electrons are emitted depends on the material of the thermionic emission element.

A typical prior art ion implantation apparatus or tool is illustrated in FIG. 1. Specifically, the prior art ion implantation apparatus comprises an ion source chamber 10 which generates ions to be implanted into a desired substrate. The generated ions are drawn by drawing electrodes 12 and their mass is analyzed by a separating electromagnet 14. After mass analysis, the ions are completely separated by slits 16 and the appropriate ions are accelerated by accelerators 18 to a final energy. A beam of ions is converged on the face of a sample or substrate 20 by a quadrupole lens 21 and scanned by scanning electrodes 22a and 22b. Deflection electrodes 24, 26 and 28 are designed to deflect the ion beam in order to eliminate uncharged particles caused by collision with residual gas.

The ion source chamber 10 is the heart of the ion implantation tool. Five different kinds of ion source chambers are currently known including: a Freeman-type ion source chamber using thermoelectrodes; a Bernas-type ion source chamber; indirectly heated cathode type ion source; microwave type ion source chamber using magnetrons; and RF sources. It should be understood that the terms "ion source" and "hot cathode discharge ion source" are used interchangeably herein.

In order to better understand the present invention, a brief description of a Freeman-type ion source, a Bernas-type ion source and a microwave type ion source is given herein. The other types of ions sources mentioned hereinabove, i.e. indirectly heated cathode and RF, are not illustrated herein, but are also well known to those skilled in the art.

FIG. 2 is a cross-sectional view of a Freeman-type ion source chamber 10. Specifically, in this ion source, plasma is generated by emitting thermoelectrons from a bar-shaped filament 30, an electrical field is generated parallel to filament 30 by an electromagnet 32, a rotating field is caused by filament current, and electrons are moved in the chamber by a reflector 34, thereby improving the efficiency in ionization. The ions generated in the chamber pass through slit 36 and are guided in a direction perpendicular to the filament.

FIG. 3 is a cross-sectional view of a Bernas-type ion source chamber 10 containing molybdenum (Mo) as the main ingredient. The ion source chamber 10 includes a tungsten (W) filament 40 and its opposing electrode 44. The ion source chamber is supplied with the desired gas from gas line 46 and emits thermoelectrons from the filament.

A typical microwave ion source is shown in FIG. 4. Specifically, in this chamber 10, plasma is generated in a discharge box 50 using a microwave caused by magnetron 52. Since this chamber has no filaments, its lifetime is not shortened even by the use of reactive gases. However, metal as well as ions are extracted from the chamber and are attracted to the surfaces of drawing electrodes 54; therefore, a desired voltage cannot be applied or the metal or ions may reach a sample to contaminate it.

Each of the above described ion sources exhibits the problem mentioned herein above. Prior art solutions to the short lifetime problem exhibited by these hot cathode discharge ion sources involve either replacing the hot cathode discharge ion source or coating the interior walls of the ion implantation apparatus with a material that is resistant to chemical attack. The latter solution is described, for example, in U.S. Pat. No. 5,656,820 to Murakoshi, et al.

Despite the success of such prior art processes, there exists a need to develop a new and improved method of extending the lifetime of hot cathode discharge ion sources. Such a method is needed since the prior art solutions are either too time consuming or add additional operating costs to the overall process. The prior art solution also yields an unwanted contaminant, molybdenum, into the substrate when implanting a BF$_2$ species.

SUMMARY OF THE INVENTION

An object of the present invention is to provide a simple, yet cost effective method for extending the lifetime of a hot cathode discharge ion source.

Another object of the present invention is to provide a method for removing material deposited on surfaces within the ion implant tool.

A feature of the present invention is that the lifetime of a hot cathode discharge ion source is extended when fluorine-containing gases, such as $GeF_4$, $BF_3$, and $SiF_4$, are employed as the implantation gas.

An advantage of the present invention is that down time and the cost of ownership of ion implantation tools is substantially reduced.

These as well as other objects, features, and advantages are accomplished by a method of ion implanting a substrate, comprising the step of providing an ion implant tool having an ion source chamber. An implant gas is fed into the ion source chamber. The gas comprises a reactive species. The substrate is implanted. Introduction of the reactive species into the ion implant chamber is stopped. A nitrogen containing gas is introduced into the ion source chamber for a period of time extending after stopping the introduction of the reactive species.

Another aspect the invention is a method of running an ion implantation tool, comprising providing an ion implantation apparatus comprising an ion source chamber. A nitrogen-containing gas and an implantation gas are introduced into the ion source chamber at substantially the same time. The tool is then run for implanting. The implantation gas is then turned off and the nitrogen-containing gas flow is continued.

The method of the present invention is particularly applicable for use in ion implantation apparatuses wherein highly fluorinated gases such as $GeF_4$ are employed as the implantation gas. The term "highly fluorinated" is used herein to denote a gaseous compound which contains more than a single molecule of fluorine. It has been observed that an improvement in the lifetime of the hot cathode ion source can be obtained when a nitrogen-containing gas is used in conjunction with $GeF_4$ source gas. Similar improvements are expected to be observed with other implantation gases.

DETAILED DESCRIPTION OF THE INVENTION

Figure 1:
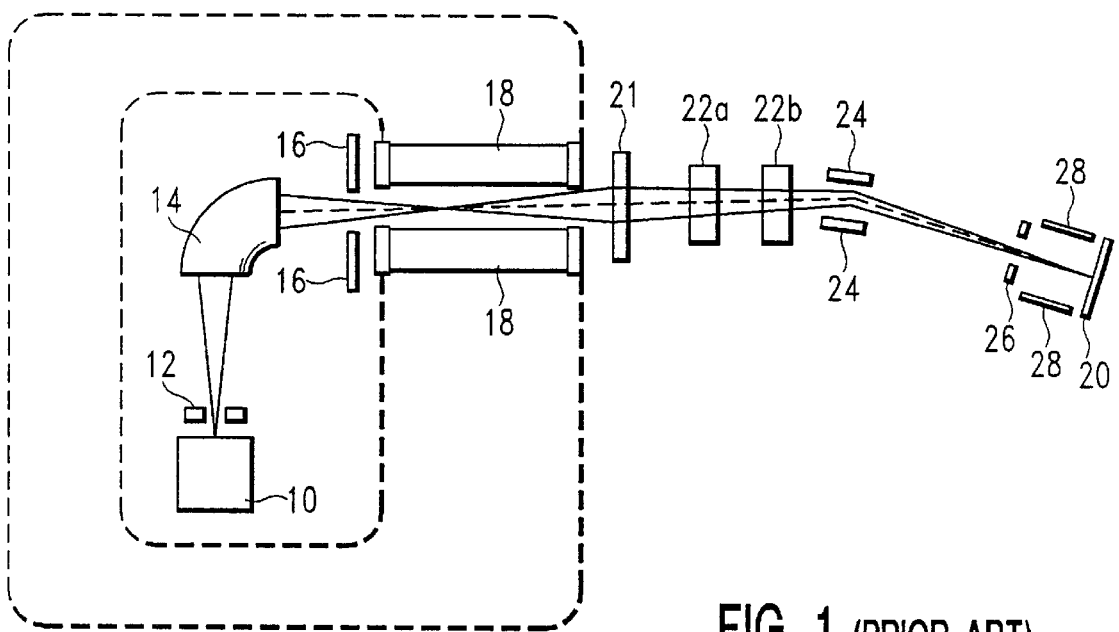
FIG. 1 is a cross-sectional view of a typically prior art ion implantation apparatus that can be employed in the present invention.

The present invention provides an improved method for extending the lifetime of a hot cathode discharge ion source used in ion implantation beyond the improvement provided in commonly assigned U.S. patent application Ser. No. 09/154,426, incorporated herein by reference. It also provides a way to switch ion implant species when one of the species is $GeF_4$. The present inventors discovered that they could switch from $BF_3$ to $GeF_4$ by extracting a nitrogen beam between implanting the two species. The present invention is not limited to the use of any one type of ion implantation apparatus or hot cathode discharge ion source. It can be used with the ion implantation apparatus shown in FIG. 1 as well as any other type of ion implantation apparatus now known to those skilled in the art or those that will be developed in the future.

Figure 2:
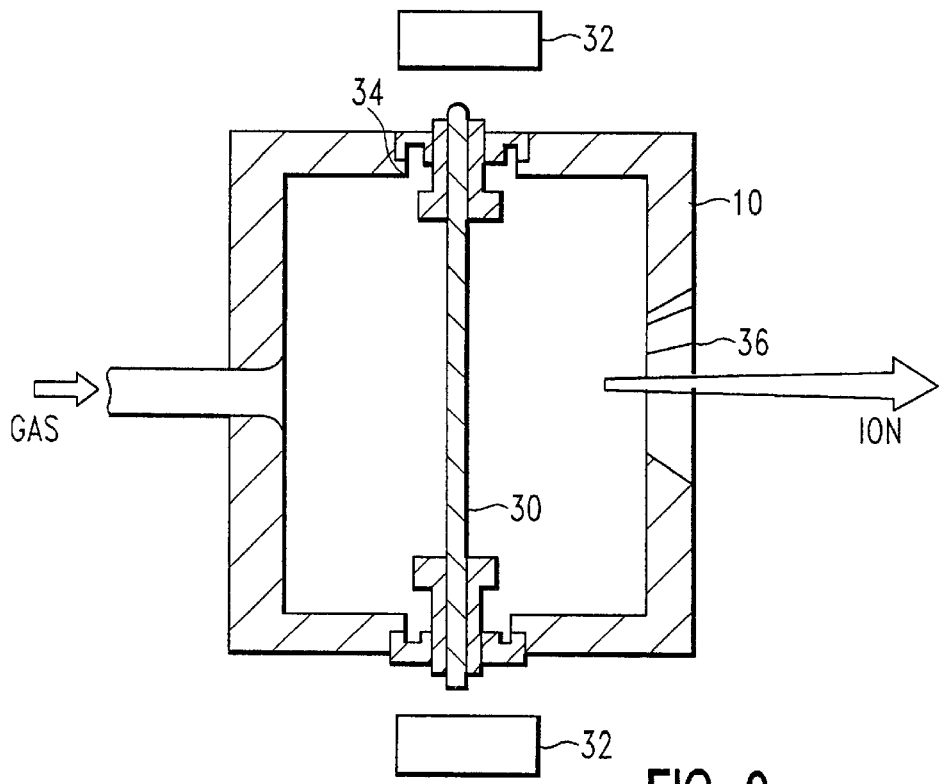
FIG. 2 is a cross-sectional view showing the various components of a prior art Freeman-type ion source.
Figure 3:
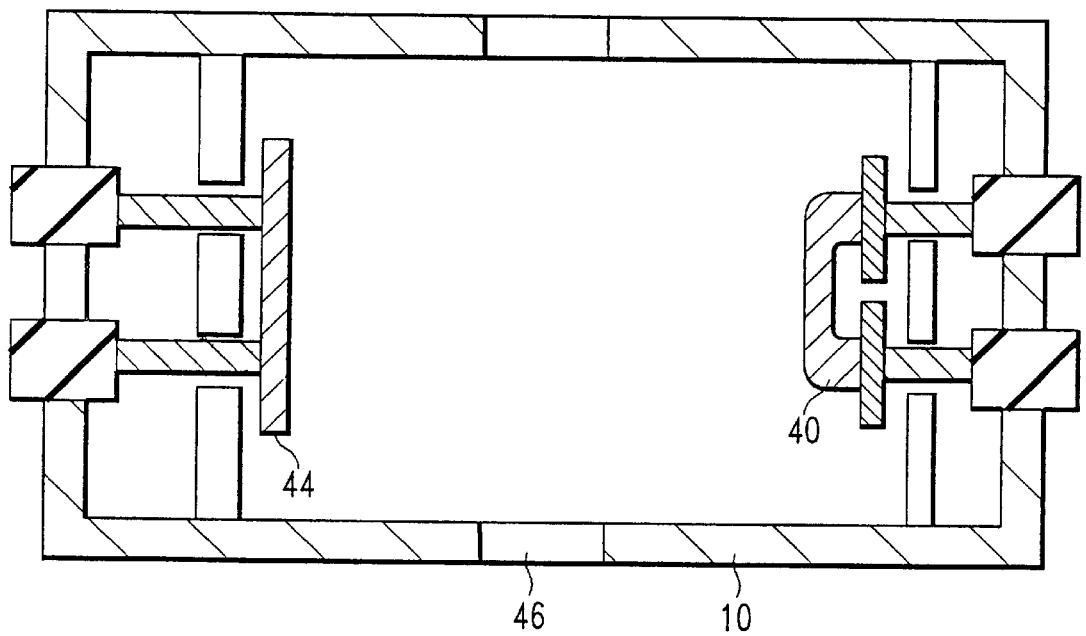
FIG. 3 is a cross-sectional view showing the various components of a prior art Bernas-type ion source.
Figure 4:
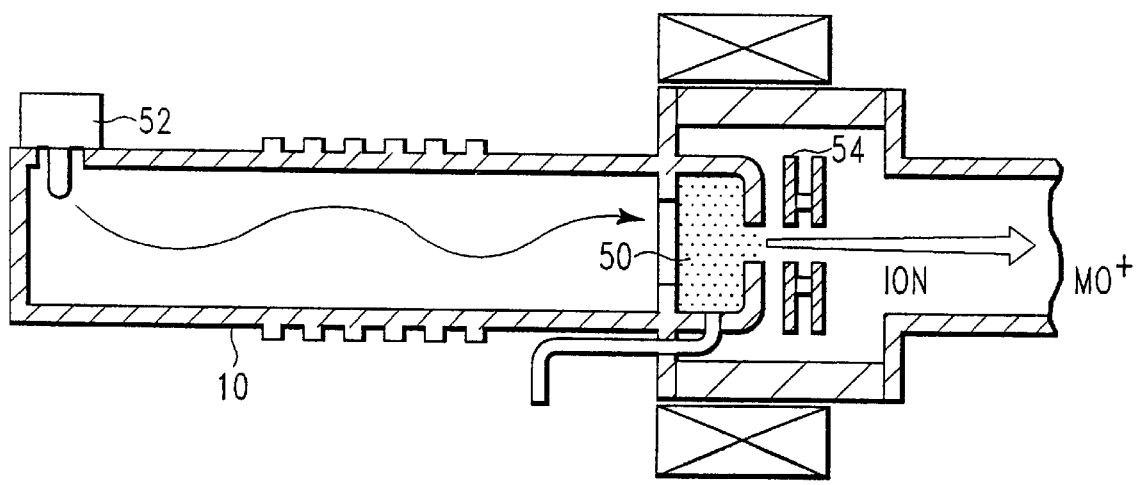
FIG. 4 is a cross-sectional view showing the various components of a prior art microwave ion source.

Additionally, the method of the present invention can be used with any type of hot cathode discharge ion source including, but not limited to: the Freeman-type ion source as previously described and shown in FIG. 2, the Bernas-type ion source as previously described and shown in FIG. 3; the microwave ion source as previously described and shown in FIG. 4; an indirectly heated cathode type ion source; and a RF ion source.

The present invention extends the life of the hot cathode discharge ion source by introducing a nitrogen-containing gas into the ion source chamber after introduction of the implantation gas is stopped.

In one embodiment, both the ion implantation gas and the nitrogen-containing gas are co-bled into the ion source chamber during implantation and the nitrogen-containing gas continues to be introduced into the ion source chamber after introduction of the implantation gas is stopped.

The term "co-bleed" is used herein to denote that the nitrogen-containing gas and the implantation gas are introduced into the ion source chamber of the ion implantation apparatus at substantially the same time. The aforementioned gas co-bleed is maintained throughout the entire ion implantation process and the implantation process is operated using conventional ion implantation conditions that are well known to those skilled in the art. During the co-bleed the mass analyzer of the ion implant tool is set to capture nitrogen-containing gas and pass the implantation gas.

Suitable nitrogen-containing gases that can be employed in the present invention include, but are not limited to: nitrogen, air (dry or wet), $NF_3$, $NO$, $N_2O$, $NO_3$, $N_2O_3$, $NO_3F$, $NOBr$, $NOF$, $NO_2F$ and mixtures thereof. Of these nitrogen-containing gases, nitrogen gas is highly preferred in the present invention.

In accordance with one preferred embodiment of the present invention, the concentration of co-bleed gas, such as nitrogen, is 20% to about 80% of the total gas flow in standard cubic centimeters per minute. More preferably, the concentration of the co-bleed gases is from about 50% to about 70% the total gas flow. The flow rate of the co-bleed gases is controlled by conventional gas flow meters or other means well known to those skilled in the art.

Suitable ion implantation gases, i.e. source gases, that can be employed in conjunction with the nitrogen-containing co-bleed include, but are not limited to: fluorinated gases such $GeF_4$, $SiF_4$, $Si_2F_6$, $BF_3$, $SF_6$, $S_2F_6$, and $SF_4$ as well as other gases such as $AsH_4$ and $PH_3$. A highly preferred ion implantation gas that can be used in conjunction with a nitrogen-containing gas is $GeF_4$.

Without the use of nitrogen the lifetime of a tungsten hot cathode and a molybdenum or tungsten arc chamber was from about 10 to 30 hours of operation with $GeF_4$. With the nitrogen co-bleed, the lifetime of the tungsten hot cathode improves about 10 hours to a range of about 20 to 40 hours. Inventors found that lifetime is further improved by 10 hours to a range of about 30 to 50 hours by continuing to provide nitrogen to the source and then extracting a nitrogen beam from the source for 5 minutes after introduction of $GeF_4$ is stopped. Improvement was also found with times in the range of 2 to 5 minutes. The nitrogen may be continued for a range of 1 to 10 minutes with benefit for the source lifetime. In the extraction of nitrogen, the mass analyzer of the ion implant tool is set to permit the nitrogen to pass through to clean down stream components, such as apertures and surfaces throughout the beam line.

The inventors also observed that the arc current varies as the cleaning nitrogen flows, reaching a maximum and then declining. The inventors found that excellent results are achieved if the nitrogen clean step continues only until the maximum is reached, after which normal production gas flow resumes. Software can be implemented to automate the procedure to monitor rate of change of arc current and to resume normal gas flow when the slope of the change in arc current with time reaches zero. A similar process can be implemented to control the clean beam when the nitrogen beam current stabilizes or when nitrogen beam current reaches a desired current level. All three parameters, rate of change of arc current, beam current, and beam stability can be measured simultaneously, and the nitrogen clean can be stopped when all three reach the desired level.

This nitrogen flow for cleaning the source and the extracted nitrogen beam for cleaning downstream components can be accomplished in parallel with unloading wafers from the implant chamber and loading the next batch of wafers into the chamber. This transfer takes about two minutes for a tool that unloads and loads about 13 wafers. The nitrogen flow can be provided during this time, avoiding or minimizing negative effect on throughput. Thus, the germanium gas can be stopped while the nitrogen can continue to flow to clean the various components in the arc chamber, including the filament, the repeller, the cathode, insulators, and the arc slit. In addition nitrogen or accelerated nitrogen ions from the source are available for cleaning components outside the arc chamber, including the filament isolation block, electrodes and other apertures. To facilitate cleaning downstream components, flow of electrons along the beam path can be adjusted to encourage beam divergence or beam blow up.

The inventors found that cleaning can also be accomplished periodically rather than between every implant step, such as once or twice per shift, or at a fixed interval of germanium beam hours, such as every 10 hours for 2 to 5 minutes. The cleaning can also be accomplished to extend the life of a source when the plasma becomes unstable. The inventors found that a 5 minute nitrogen clean extended the life of the source for six to ten hours. After the cleaning step regular germanium flow or co-bleed of germanium gas with nitrogen gas resumes for the next ion implant. The nitrogen clean can also be used before switching implant species, for example from a germanium containing species to a boron containing species.

The method of the present invention is suitable for use in a wide range of applications wherein ion implantation is required. The method of the present invention is however extremely applicable for use in the semiconductor industry to provide a semiconductor wafer, chip or substrate with source/drain regions or to pre-amorphize the semiconductor wafer of substrate.

While the invention has been particularly shown and described with respect to preferred embodiments thereof, it will be understood by those skilled in the art that the foregoing and other changes in form and detail may be made without departing from the spirit and scope of the present invention.

We claim:

1. A method of ion implanting a substrate, comprising the steps of:
   a) providing an ion implant tool having an ion source chamber;
   b) providing an implant gas into said ion source chamber, said gas comprising a reactive species;
   c) stopping introduction of said reactive species into said ion implant chamber; and
   d) providing a nitrogen containing gas in said ion source chamber for a period of time after stopping introduction of said reactive species.

2. The method as recited in claim 1, further comprising, between said step (b) and said step (c) the step of implanting the substrate.

3. The method as recited in claim 1, further comprising the step of ionizing said nitrogen containing gas and extracting said ions from said source.

4. The method as recited in claim 3, further comprising the step of passing said nitrogen ions through a mass analyzer to provide a nitrogen beam.

5. The method as recited in claim 4, further comprising the step of using said nitrogen ions to clean downstream apertures.

6. The method as recited in claim 1, wherein in step (d) providing said nitrogen containing gas for a time on the order of about 1 to about 10 minutes after said stopping step (d).

7. The method as recited in claim 6, wherein in step (d) providing said nitrogen containing gas for a time on the order of about 5 minutes after said stopping step (d).

8. The method as recited in claim 1, wherein in step (d) providing said nitrogen containing gas for a time until arc current reaches a maximum.

9. The method as recited in claim 1, wherein in step (d) providing said nitrogen containing gas for a time until nitrogen beam current reaches a desired value or is stable.

10. The method as recited in claim 1, wherein in step (b) said species comprises boron, germanium, or fluorine.

11. The method as recited in claim 10, wherein in step (b) said reactive species comprises $BF_3$ and said nitrogen containing gas comprises nitrogen, said method further comprising the step of providing a implant gas comprising $GeF_4$ after said nitrogen providing step.

12. The method as recited in claim 10, wherein in step (b) said gas comprises $GeF_4$.

13. The method as recited in claim 10, further comprising the step of bleeding a nitrogen containing gas during said providing step (b) and continuing providing said nitrogen containing gas for a period of time after stopping introduction of said species.

14. The method as recited in claim 1, wherein the ion implant tool comprises a surface and wherein said reactive species reacts to provide a coating on said surface.

15. The method as recited in claim 14, wherein said surface is a surface of said ion source or a surface of a downstream component.

16. The method as recited in claim 15, wherein in said step (d) said nitrogen containing gas is for reacting with said coating to remove at least a portion of said coating.

17. The method as recited in claim 14, wherein the ion implant tool comprises a beam path and apertures and wherein said surface comprises a surface of said apertures, wherein said step (d) further comprising accelerating said nitrogen along said beam path to remove a least a portion of said coating on said apertures.

18. The method as recited in claim 17, further comprising the step of diverging said nitrogen beam so it strikes aperture surfaces along said beam path.

19. The method as recited in claim 18, wherein said diverging sep comprises adjusting a flow of electrons in said nitrogen beam path.

20. The method as recited in claim 1, wherein said nitrogen providing step (d) is for reducing flaking of said coating during subsequent implants.

21. The method as recited in claim 1, wherein said nitrogen providing step (d) is provided during loading and unloading of wafers.

22. The method as recited in claim 1, wherein said nitrogen providing step (d) is provided at a set interval of germanium beam-on hours.

23. The method as recited in claim 22, wherein said nitrogen providing step (d) is provided every six to twelve hours.

24. The method as recited in claim 1 wherein said nitrogen providing step (d) is provided at end of source life when arc control, beam current, or beam stability is lost.

25. A method of running an ion implantation tool, comprising:
   a) providing an ion implantation apparatus comprising an ion source chamber;
   b) introducing a nitrogen-containing gas and an implantation gas into said ion source chamber at substantially the same time;
   c) implanting; and
   d) turning off said implantation gas and continuing introducing said nitrogen-containing gas.

26. The method of claim 25, wherein said ion source chamber comprises a hot cathode discharge ion source.

27. The method of claim 26, wherein and said method is for extending the lifetime of said hot cathode discharge ion source.

28. The method of claim 27, wherein said hot cathode discharge ion source comprises a thermionic emission element which, when heated to temperatures above about 1200° C., emits electrons.

29. The method of claim 26, wherein said hot cathode discharge ion source is selected from the group consisting of a Freeman-type ion source, a Bernas-type ion source, an indirectly heated cathode source, a microwave ion source and a RF source.

30. The method of claim 25, wherein said ion implantation gas is a fluorinated gas selected from the group consisting of $GeF_4$, $BF_3$, $SiF_4$, $Si_2F_6$, $SF_6$, $S_2F_6$ and $SF_4$.

31. The method of claim 25, wherein said nitrogen-containing gas is selected from the group consisting of nitrogen, air (dry or wet), $NF_3$, $NO$, $N_2O$, $NO_3$, $N_2O_3$, $NO_3F$, $NOBr$, $NOF$, $NO_2F$ and mixtures thereof.

32. The method of claim 25, wherein said nitrogen containing gas is introduced at a flow rate from about 20% to about 80% of a flow rate of said ion implantation gas.

33. The method of claim 25, wherein said nitrogen containing gas is introduced at a flow rate from about 50% to about 70% of a flow rate of said ion implantation gas.

34. The method of claim 25, wherein said nitrogen is introduced throughout the entire ion implantation operation.

* * * * *